(12) United States Patent
Ogawa et al.

(10) Patent No.: US 9,472,441 B2
(45) Date of Patent: Oct. 18, 2016

(54) SUBSTRATE PROCESSING APPARATUS

(71) Applicant: Ebara Corporation, Tokyo (JP)

(72) Inventors: Takahiro Ogawa, Tokyo (JP); Hisajiro Nakano, Tokyo (JP)

(73) Assignee: Ebara Corporation, Tokyo (JP)

( * ) Notice: Subject to any disclaimer, the term of this patent is extended or adjusted under 35 U.S.C. 154(b) by 548 days.

(21) Appl. No.: 13/869,849

(22) Filed: Apr. 24, 2013

(65) Prior Publication Data

US 2013/0320636 A1    Dec. 5, 2013

(30) Foreign Application Priority Data

Apr. 25, 2012  (JP) ................. 2012-099340

(51) Int. Cl.
*H01L 21/687* (2006.01)
*B23B 31/12* (2006.01)

(52) U.S. Cl.
CPC ...... *H01L 21/68728* (2013.01); *B23B 31/1261* (2013.01); *H01L 21/687* (2013.01); *Y10T 279/18* (2015.01); *Y10T 279/19* (2015.01); *Y10T 279/26* (2015.01)

(58) Field of Classification Search
CPC ........... H01L 21/68728; H01L 21/687; B23B 31/1261; Y10T 279/19; Y10T 279/18; Y10T 279/26
USPC ................................................ 279/106–110
See application file for complete search history.

(56) References Cited

U.S. PATENT DOCUMENTS

| | | | |
|---|---|---|---|
| 6,167,893 B1 * | 1/2001 | Taatjes et al. | 134/147 |
| RE37,347 E * | 9/2001 | Maekawa et al. | 34/58 |
| 2002/0153676 A1 * | 10/2002 | Noguchi | 279/106 |
| 2005/0252535 A1 * | 11/2005 | Nishioka et al. | 134/33 |
| 2006/0011300 A1 * | 1/2006 | Kim et al. | 156/345.51 |
| 2008/0110861 A1 * | 5/2008 | Kajita et al. | 216/83 |
| 2011/0260080 A1 * | 10/2011 | Zama et al. | 250/559.14 |
| 2012/0205850 A1 * | 8/2012 | Zama et al. | 269/55 |
| 2014/0197610 A1 * | 7/2014 | Miyazaki et al. | 279/133 |

FOREIGN PATENT DOCUMENTS

| | | |
|---|---|---|
| JP | 08-255776 | 10/1996 |
| JP | 10-059540 | 3/1998 |

(Continued)

*Primary Examiner* — Eric A Gates
*Assistant Examiner* — Paul M Janeski
(74) *Attorney, Agent, or Firm* — Baker & Hostetler LLP (57) ABSTRACT

A substrate processing apparatus is used for a spin drying apparatus, a pencil-type scrubbing cleaning apparatus, an IPA drying apparatus and the like, which are used as semiconductor wafer processing apparatuses. The substrate processing apparatus includes a substrate stage and a substrate chuck mechanism. The substrate chuck mechanism includes a chuck body having a substrate placing portion configured to place a peripheral portion of a substrate and a guide surface configured to guide an outer circumferential end surface of the substrate and to position the substrate when the substrate is placed on the substrate placing portion, and a chuck claw rotatably supported on the chuck body and configured to hold the peripheral portion of the substrate between the substrate placing portion and the chuck claw by turning the chuck claw inward in a closing direction. The guide surface comprises a first guide surface and a second guide surface which guide the outer circumferential end surface of the substrate and differ in inclinations from each other.

6 Claims, 9 Drawing Sheets

(56) References Cited

FOREIGN PATENT DOCUMENTS

| JP | 11-176787 | 7/1999 |
| JP | 2003-303871 | 10/2003 |
| JP | 2004-273847 A | 9/2004 |
| JP | 2004-356517 | 12/2004 |
| JP | 2009-105116 A | 5/2009 |
| JP | 2009-188399 A | 8/2009 |
| JP | 2010-021257 A | 1/2010 |

* cited by examiner

SUBSTRATE PROCESSING APPARATUS

CROSS REFERENCE TO RELATED APPLICATIONS

This application claims priority to Japanese Patent Application No. 2012-99340 filed Apr. 25, 2012, the entire contents of which are hereby incorporated by reference.

BACKGROUND OF THE INVENTION

1. Field of the Invention

The present invention relates to a substrate processing apparatus for use in a spin drying apparatus (SRD), a pencil-type scrubbing cleaning apparatus, an IPA (isopropyl alcohol) drying apparatus and the like, which are used as semiconductor wafer processing apparatuses for example.

2. Description of the Related Art

In the semiconductor manufacturing process, after processing a semiconductor wafer by various processing steps, a surface of the semiconductor wafer is cleaned by supplying a cleaning liquid onto the surface of the semiconductor wafer. In a polishing step for polishing a semiconductor wafer, a polishing liquid such as a slurry and polished debris attached to the surface of the semiconductor wafer are removed by supplying a cleaning liquid onto the surface of the polished semiconductor wafer. Then, the cleaned semiconductor wafer is rotated at a high speed to scatter droplets attached to the surface of the semiconductor wafer, thereby drying the semiconductor wafer.

Figure 1:
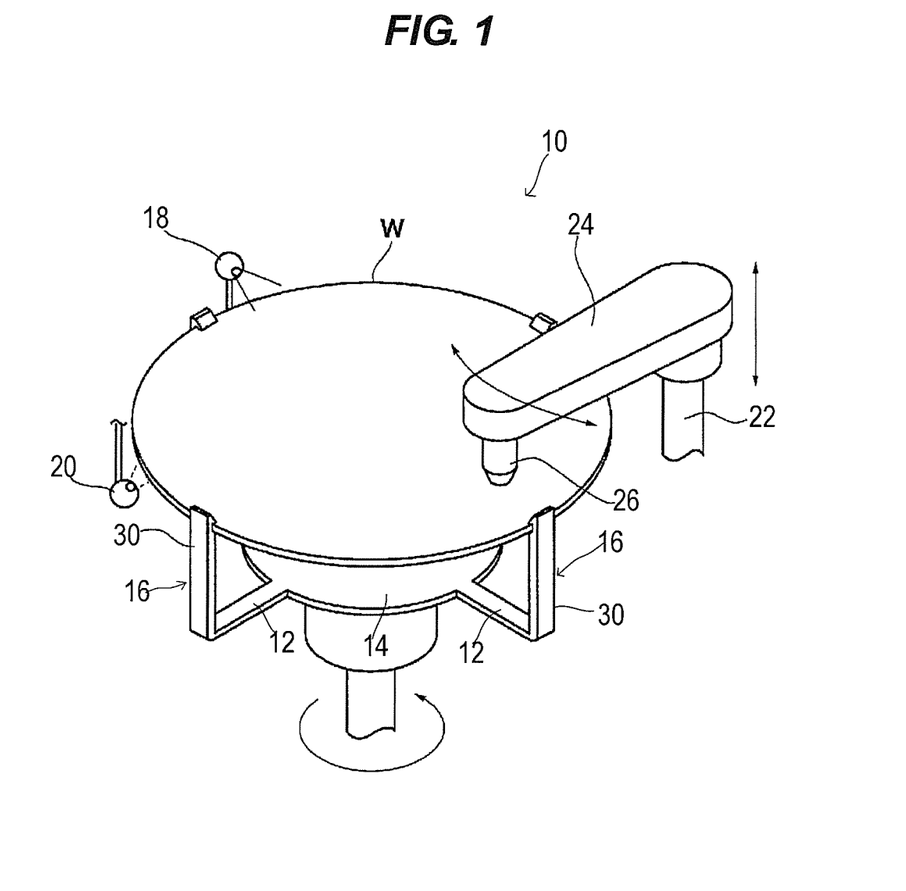
FIG. 1 is a schematic perspective view showing a conventional pencil-type scrubbing cleaning apparatus.

FIG. 1 shows an example of a pencil-type scrubbing cleaning apparatus widely known as a substrate cleaning apparatus for cleaning a surface of the substrate such as a semiconductor wafer by supplying a cleaning liquid onto the surface of the substrate. As shown in FIG. 1, the pencil-type scrubbing cleaning apparatus 10 has a rotatable substrate stage 14 having a plurality of arms 12 (four arms in this example) extending radially outwardly in a radial direction of the substrate, a plurality of substrate chuck mechanisms 16 fixed to respective distal ends of the arms 12 for gripping a peripheral portion of the substrate W, and an upper cleaning liquid supply nozzle 18 and a lower cleaning liquid supply nozzle 20 for supplying a cleaning liquid such as a chemical solution or pure water onto a front surface and a rear surface, respectively of the substrate W which is gripped at its peripheral portion by the substrate chuck mechanisms 16.

A vertically movable and rotatable support shaft 22 is vertically provided at the side of the substrate stage 14, and a base end of an oscillation arm 24 extending horizontally is connected to an upper end of the support shaft 22. A pencil-type cleaning member 26 made of, for example, PVA sponge extends downward in a vertical direction and is attached to a free end of the oscillation arm 24.

According to the pencil-type scrubbing cleaning apparatus 10, the surface of the substrate W is scrub-cleaned by supplying a cleaning liquid from the upper cleaning liquid supply nozzle 18 onto the surface of the substrate W which is gripped at its peripheral portion and rotated at a predetermined rotational speed by the substrate chuck mechanisms 16, and simultaneously by moving the pencil-type cleaning member 26 in one direction while pressing the pencil-type cleaning member 26 at a predetermined pressing force against the surface of the substrate W. At this time, if necessary, a cleaning liquid is supplied onto the rear surface of the substrate W from the lower cleaning liquid supply nozzle 20. Then, after stopping the supply of cleaning liquid, the substrate W is rotated at a high speed to scatter droplets attached to the surface of the substrate W, thereby drying the substrate W.

Figure 2:
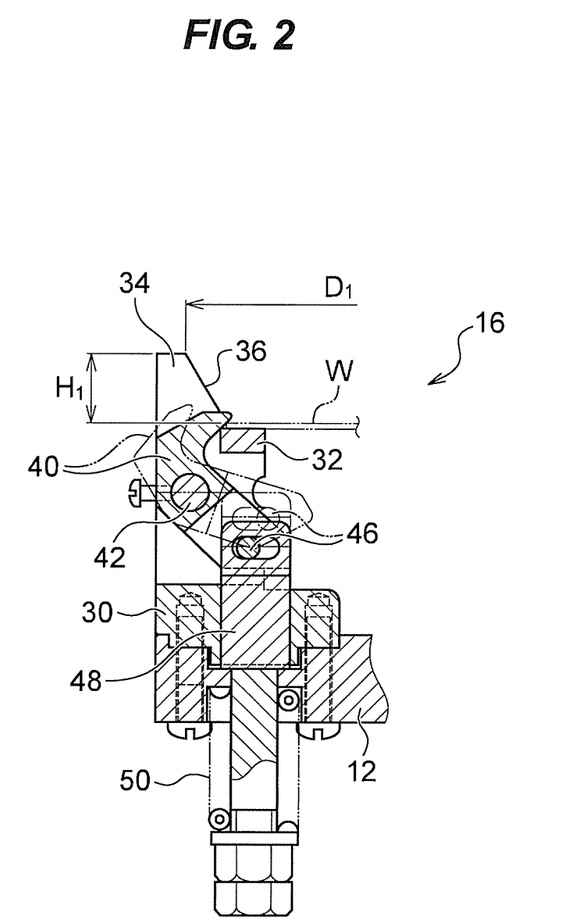
FIG. 2 is a cross-sectional view showing a substrate chuck mechanism of the pencil-type scrubbing cleaning apparatus shown in FIG. 1.

FIG. 2 is a cross-sectional view of the substrate chuck mechanism 16. As shown in FIG. 2, the substrate chuck mechanism 16 has a chuck body 30 extending upward and connected at its lower end to the distal end of the arm 12. A substrate placing portion 32 for placing and holding the peripheral portion of the substrate W is attached at a predetermined position along a height direction of the chuck body 30. A guide portion 34 extending upward from the substrate placing portion 32 of the chuck body 30 has an inner circumferential surface which is inclined downward toward a radially inward direction of the substrate stage. The inner circumferential surface of the guide portion 34 serves as a guide surface 36 having a predetermined inclined angle for guiding the outer circumferential end surface of the substrate W and positioning the substrate W when the substrate W is placed on the substrate placing portion 32. The inclined angle is 60±5°.

On the chuck body 30, a chuck claw 40 is rotatably supported via a support shaft 42 to hold the peripheral portion of the substrate W between the substrate placing portion 32 and the chuck claw 40 by turning the chuck claw 40 inward in a closing direction. A lower portion of the chuck claw 40 is connected via a coupling pin 46 to an upper end of a vertically movable columnar opening pin 48. The opening pin 48 is urged downward under a resilient force of a helical spring 50.

With this configuration, the opening pin 48 is moved downward under the resilient force of the helical spring 50 to turn the chuck claw 40 inward in a closing direction, thereby gripping the peripheral portion of the substrate W between the substrate placing portion 32 and the chuck claw 40. Further, the opening pin 48 is lifted against the resilient force of the helical spring 50 to turn the chuck claw 40 outward in an opening direction, thereby releasing the gripping of the peripheral portion of the substrate W between the substrate placing portion 32 and the chuck claw 40.

In this kind of pencil-type scrubbing cleaning apparatus 10, in consideration of safety or the like of transferring of the substrate W, when processing (cleaning) the substrate W having a diameter of 300 mm for example, the substrate chuck mechanisms 16 configured to define an opening (scoop opening) which is defined by connecting upper ends of the guide surfaces 36 of the guide portions 34 in a circular arc shape and has an inner diameter $D_1$ of approximately 308.559 mm, are generally used. In this case, the height $H_1$ of the guide portion 34 from an upper surface of the substrate placing portion 32 is approximately 8.5 mm.

Specifically, the substrate W is held generally by a robot hand, and transferred above the substrate stage 14. At this time, each of the substrate chuck mechanisms 16 stands by with the chuck claw 40 kept open outwardly. Then, by lowering the robot hand, the substrate is transferred from the robot hand to the pencil-type scrubbing cleaning apparatus 10. In consideration of deviation (backlash) of the substrate in the robot hand, teaching error by an operator, and the like, the inner diameter $D_1$ of the opening is set to be larger than the diameter of the substrate W so as to accept the substrate W reliably within the opening (scoop opening) defined by connecting the upper ends of the guide surfaces 36 in a circular arc shape. Further, the inclined angles of the guide surfaces 36 are determined to allow the substrate W to be placed in a predetermined position by its own weight by guiding the substrate W with the guide surfaces (inner circumferential surfaces) 36 of the guide portions 34 as the robot hand is lowered. Therefore, the inclined angles of the guide surfaces 36 need to be steep to some extent, and further, as described above, the inner diameter $D_1$ of the opening needs to be large to some extent, resulting in increasing height of the guide portions 34 from the upper surfaces of the substrate placing portions 32.

When the substrate chuck mechanism 16 having the guide portion 34 enlarged in its size is used, the amount of the cleaning liquid (water) scattered when the substrate W is gripped and rotated by the substrate chuck mechanisms 16 is increased, and a large airflow occurs. Therefore, the scattered cleaning liquid is highly likely to return to the surface of the substrate to re-contaminate the substrate or to contaminate the entirety of the cleaning apparatus. Especially, this tendency becomes pronounced when a rotational speed of the substrate is increased in order to enhance a throughput.

Figure 3:
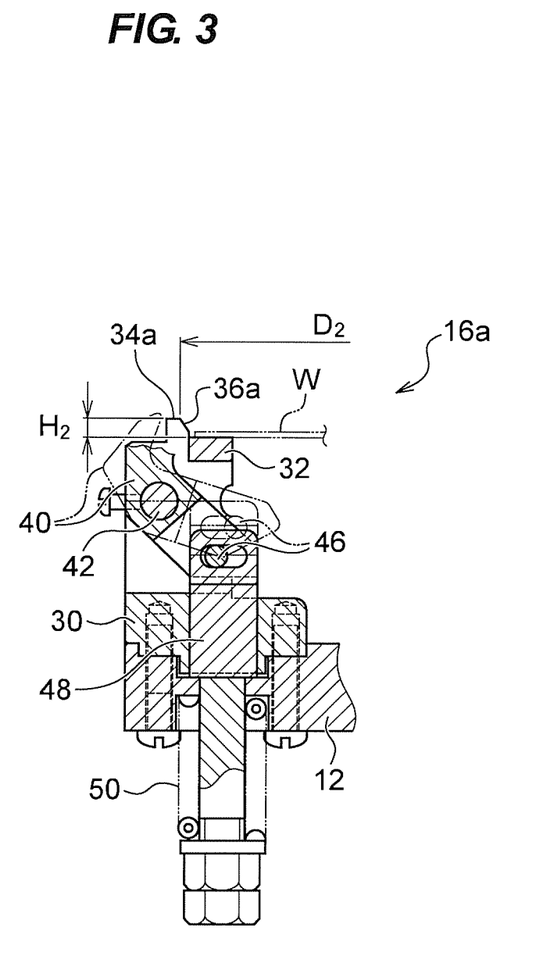
FIG. 3 is a cross-sectional view showing another example of the substrate chuck mechanism.

In order to minimize the airflow or the amount of scattered cleaning liquid (water) when the substrate W is gripped and rotated, as shown in FIG. 3, a substrate chuck mechanism 16a having a guide portion 34a which is smaller than that of the substrate chuck mechanism 16 shown in FIG. 2 and has an inner circumferential surface serving as a guide surface 36a has been used. An inner diameter $D_2$ of the opening (scoop opening) defined by connecting upper ends of the guide surfaces 36a of the guide portions 34a in the substrate chuck mechanisms 16a in a circular arc shape is 303.2 mm (302.823 mm at the minimum value) for example, and the height $H_2$ of the guide portion 34a from an upper surface of the substrate placing portion 32 is approximately 2.5 mm.

However, when the inner diameter $D_2$ of the opening defined by connecting the upper ends of the guide surfaces 36a of the guide portions 34a in a circular arc shape is made smaller, the guiding function of the guide portions 34a with respect to the substrate W is weakened to make teaching tolerance for substrate transfer much smaller in order to accept the substrate W reliably within the opening having the inner diameter $D_2$.

Further, as shown in FIG. 1, for example, when the substrate chuck mechanisms 16 are fixed to the distal ends of the four arms 12, an interval between mutually adjacent substrate chuck mechanisms 16 becomes wide, and thus the pressing force of the pencil-type cleaning member 26 against the substrate W may possibly cause the deformation or breakage of the substrate W. This tendency becomes pronounced with a higher rotational speed of the substrate W, causing an adverse effect when the rotational speed of the substrate is increased in order to enhance a throughput. Therefore, the countermeasure is demanded. Further, the substrate itself becomes delicate in its strength because of miniaturization, and the substrate is highly likely to be affected by the pressing force of the pencil-type cleaning member 26 against the substrate W.

The aforementioned matter holds true for other substrate processing apparatuses used for processing substrates, such as a spin drying apparatus (SRD) and an IPA (isopropyl alcohol) drying apparatus which are used as semiconductor wafer processing apparatuses.

The applicant of the present invention has proposed a substrate gripping apparatus capable of rotating at a high speed by minimizing a weight of a rotating unit, and a substrate cleaning apparatus configured to prevent a cleaned substrate from being re-contaminated in a drying step as disclosed in Japanese laid-open patent publication No. 10-59540 and Japanese laid-open patent publication No. 2004-356517. There has been proposed a cleaning apparatus using a mechanism, as a holding member for holding a peripheral portion of a substrate, which has a contact member configured to be brought into contact with the peripheral portion of the substrate, a stepped portion configured to support a peripheral portion of a lower surface of the substrate, and protrusion-like retaining portions for retaining an upper surface of the substrate as disclosed in Japanese laid-open patent publication No. 8-255776. Further, there has been proposed a substrate holding apparatus which has a relatively long inclined surface inclined downward and spreading out wide toward its end, and a body having a tapered portion positioned below the inclined surface and formed by a gently inclined stepped portion as disclosed in Japanese laid-open patent publication No. 2003-303871. Furthermore, there has been proposed a substrate processing apparatus in which the substrate is rotated while supporting the entire circumference of the substrate as disclosed in Japanese patent No. 3512322.

However, the above conventional technology is not the one in which the substrate is accepted reliably within an opening (scoop opening) constituted by guide surfaces of guide portions while limiting heights of the guide portions as law as possible, the inner circumferential surfaces of the guide portions serving as guide surfaces for guiding the outer circumferential end surface of the substrate and positioning the substrate.

SUMMARY OF THE INVENTION

The present invention has been made in view of the above. It is therefore an object of the present invention to provide a substrate processing apparatus which can accept a substrate reliably within an opening (scoop opening) constituted by guide surfaces of guide portions while limiting heights of the guide portions as law as possible, the inner circumferential surfaces of the guide portions serving as guide surfaces for guiding the outer circumferential end surface of the substrate and positioning the substrate.

According to the present invention, there is provided a substrate processing apparatus for gripping a peripheral portion of a substrate and rotating the substrate to process the substrate, the substrate processing apparatus comprising: a rotatable substrate stage having a plurality of arms extending radially; and substrate chuck mechanisms fixed to respective distal ends of the arms and configured to grip the peripheral portion of the substrate. The substrate chuck mechanism comprises a chuck body having a substrate placing portion configured to place the peripheral portion of the substrate and a guide surface configured to guide an outer circumferential end surface of the substrate and to position the substrate when the substrate is placed on the substrate placing portion; and a chuck claw rotatably supported on the chuck body and configured to hold the peripheral portion of the substrate between the substrate placing portion and the chuck claw by turning the chuck claw inward in a closing direction. The guide surface comprises a first guide surface configured to guide the outer circumferential end surface of the substrate which falls down by its own weight when the substrate is placed and held on the substrate placing portion, and a second guide surface configured to guide the outer circumferential end surface of the substrate which is moved while the substrate is brought into contact with the chuck claw when the peripheral portion of the substrate is held between the substrate placing portion and the chuck claw by turning the chuck claw inward in a closing direction.

According to the present invention, an inclination of the second guide surface of the guide portion can be made gentler than an inclination of the first guide surface. Therefore, a height of the guide portion can be limited to be low, and in order to accept the substrate reliably within an opening (scoop opening) defined by connecting upper ends of the first guide surfaces in a circular arc shape, an inner diameter of the opening can be set to be larger than a diameter of the substrate.

The inner diameter of the opening defined by connecting the upper ends of the first guide surfaces in a circular arc shape is preferably set to be a value obtained by adding a tolerance value to a value which is a sum of an outer diameter of the substrate to be processed and a calculated value based on three maximum values comprising a maximum value of positioning error of a robot for holding and transferring the substrate with a robot hand, a maximum value of deviation range of the substrate within the robot hand, and a maximum value of teaching error by an operator.

When processing the substrate having a diameter of 300 mm, the inner diameter of the opening (scoop opening) defined by connecting the upper ends of the first guide surfaces in a circular arc shape is 305.785 mm for example.

The height of the guide portion from an upper surface of the substrate placing portion is preferably in the range of 2.0 mm to 5.0 mm.

When processing the substrate having a diameter of 300 mm, the height of the guide portion from the upper surface of the substrate placing portion is 2.5 mm for example.

The number of the arms is preferably set to be not less than eight. With this configuration, positions where the substrate is supported can be increased, and intervals between mutually adjacent substrate chuck mechanisms can be shorter, and hence deformation or breakage of the substrate caused by pressing of a pencil-type sponge or the like against the substrate can be prevented.

The substrate placing portion may be configured to extend continuously in a ring shape. With this configuration, by supporting the peripheral portion of the substrate continuously in a ring shape, deformation or breakage of the substrate caused by pressing of the pencil-type sponge or the like against the substrate can be prevented.

It is preferable that a cutout configured to allow the robot hand to pass therethrough is provided in a part of the substrate placing portion extending continuously in a ring shape. With this configuration, the substrate held by the robot hand can be transferred to the substrate processing apparatus without causing the robot hand to interfere with the substrate placing portion.

According to the present invention, the inclination of the second guide surface of the guide portion can be made gentler than the inclination of the first guide surface. With this configuration, the height of the guide portion can be limited to be low, and in order to accept the substrate reliably within the opening (scoop opening) defined by connecting the upper ends of the first guide surfaces in a circular arc shape, the inner diameter of the opening can be set to be larger than the diameter of the substrate, thereby securing a sufficient guide width.

DETAILED DESCRIPTION OF THE PREFERRED EMBODIMENTS

Embodiments of the present invention will be described below with reference to FIGS. 4 to 9. In the following examples, a substrate processing apparatus of the present invention which is applied to the pencil-type scrubbing cleaning apparatuses 10 shown in FIG. 1, will be shown. Identical or corresponding parts are denoted by identical reference numerals in FIGS. 1 to 9, and will not be described in duplication.

Figure 4:
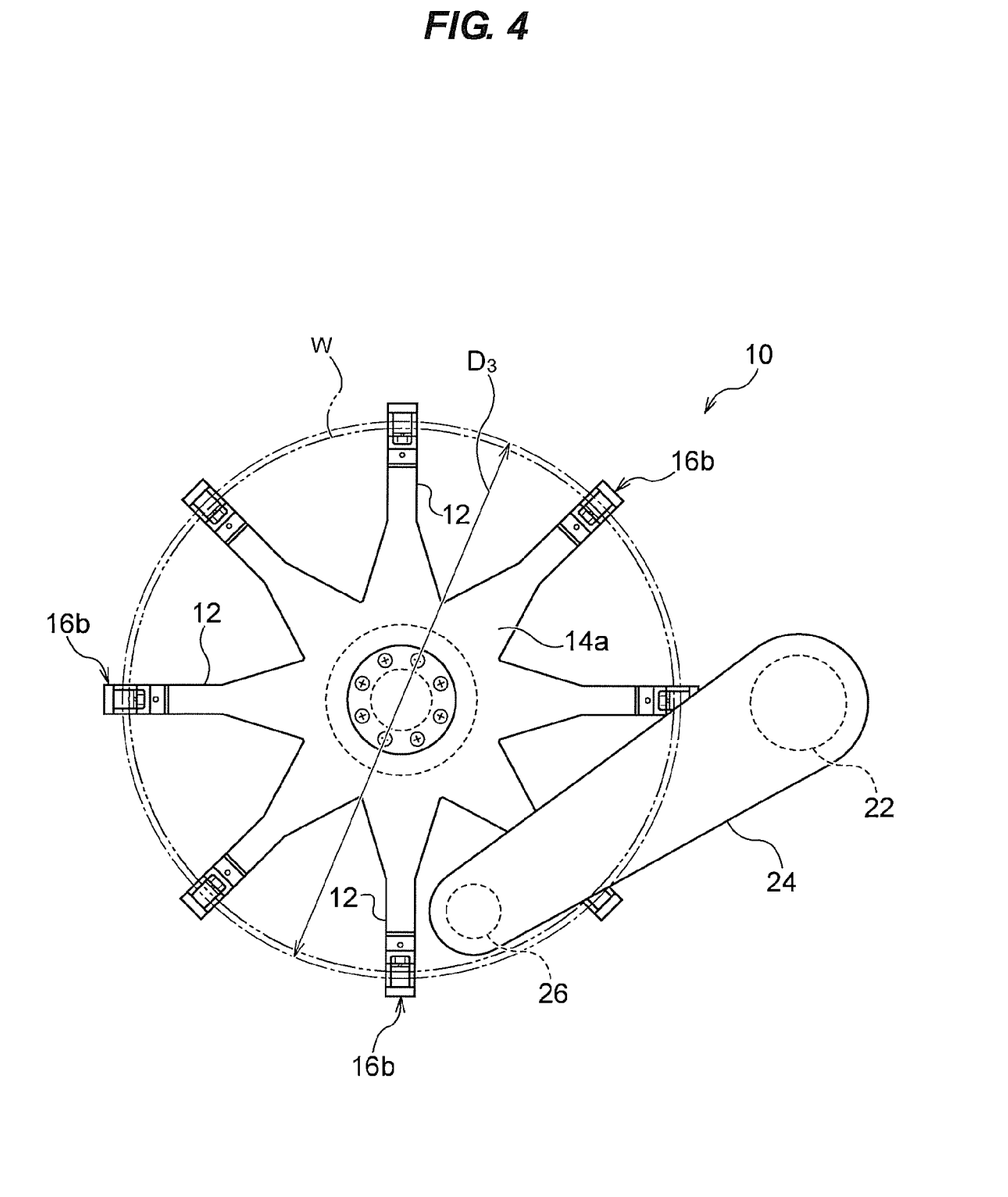
FIG. 4 is a schematic plan view showing a substrate processing apparatus according to an embodiment of the present invention which is applied to the pencil-type scrubbing cleaning apparatus shown in FIG. 1.

FIG. 4 is a schematic plan view showing a substrate processing apparatus according to an embodiment of the present invention which is applied to the pencil-type scrubbing cleaning apparatus 10 shown in FIG. 1. As shown in FIG. 4, the pencil-type scrubbing cleaning apparatus (substrate processing apparatus) 10 has a rotatable substrate stage 14a having a plurality of arms 12 (eight arms in this example) extending radially outwardly in a radial direction of the substrate, and a plurality of substrate chuck mechanisms 16b fixed to respective distal ends of the arms 12 for gripping the peripheral portion of the substrate W. Although not shown in FIG. 4, the pencil-type scrubbing cleaning apparatus 10 has an upper cleaning liquid supply nozzle 18 and a lower cleaning liquid supply nozzle 20 for supplying a cleaning liquid such as a chemical solution or pure water onto a front surface and a rear surface, respectively of the substrate W as shown in FIG. 1.

A vertically movable and rotatable support shaft 22 is vertically provided at the side of the substrate stage 14a, and a base end of an oscillation arm 24 extending horizontally is connected to an upper end of the support shaft 22. A pencil-type cleaning member 26 made of, for example, PVA sponge extends downward in a vertical direction and is attached to a free end of the oscillation arm 24.

Figure 5:
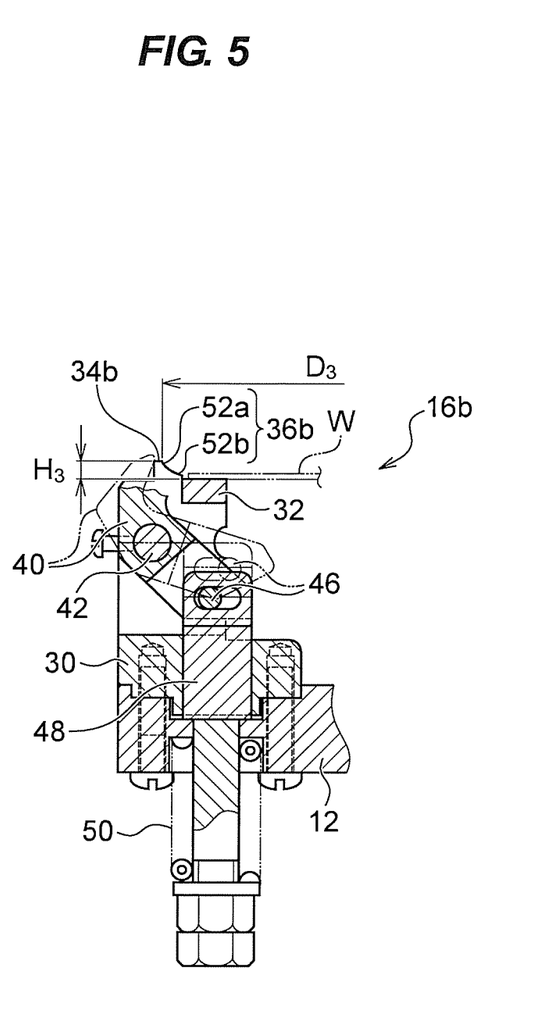
FIG. 5 is a cross-sectional view showing a substrate chuck mechanism of the pencil-type scrubbing cleaning apparatus (substrate processing apparatus) shown in FIG. 4.

FIG. 5 is a cross-sectional view of the substrate chuck mechanism 16b. As shown in FIG. 5, the substrate chuck mechanism 16*b* has a chuck body 30 extending upward and connected at its lower end to the distal end of the arm 12, and a chuck claw 40 for holding the peripheral portion of the substrate W between a substrate placing portion 32 and the chuck claw 40 by turning the chuck claw 40 inward in a closing direction. A guide portion 34*b* extending upward from the substrate placing portion 32 of the chuck body 30 has an inner circumferential surface serving as a guide surface 36*b* for guiding the outer circumferential end surface of the substrate W and positioning the substrate W when the substrate W is placed on the substrate placing portion 32.

The guide surface 36*b* of the guide portion 34*b* comprises a first guide surface 52*a* for guiding the outer circumferential end surface of the substrate W which falls down by its own weight when the substrate W is placed and held on the substrate placing portion 32, and a second guide surface 52*b* for guiding the outer circumferential end surface of the substrate W which is moved while the substrate W is brought into contact with the chuck claw 40 when the peripheral portion of the substrate W is held between the substrate placing portion 32 and the chuck claw 40 by turning the chuck claw 40 inward in a closing direction. The first guide surface 52*a* and the second guide surface 52*b* are connected by a smooth curved surface to avoid a step.

The pencil-type scrubbing cleaning apparatus 10 of this example is used for processing (cleaning) the substrate having a diameter of 300 mm. The inner diameter $D_3$ of the opening (scoop opening) defined by connecting upper ends of the first guide surfaces 52*a* of the guide portions 34*b* in a circular arc shape is set to be 305.785 mm, and the height $H_3$ of the guide portion 34*b* from an upper surface of the substrate placing portion 32 is set to be 2.5 mm. In FIG. 4, the opening (scoop opening) having the inner diameter $D_3$ is indicated by a dotted-dashed line.

The height $H_3$ of the guide portion 34*b* from the upper surface of the substrate placing portion 32 is preferably in the range of 2.0 mm to 5.0 mm.

Figure 6A:
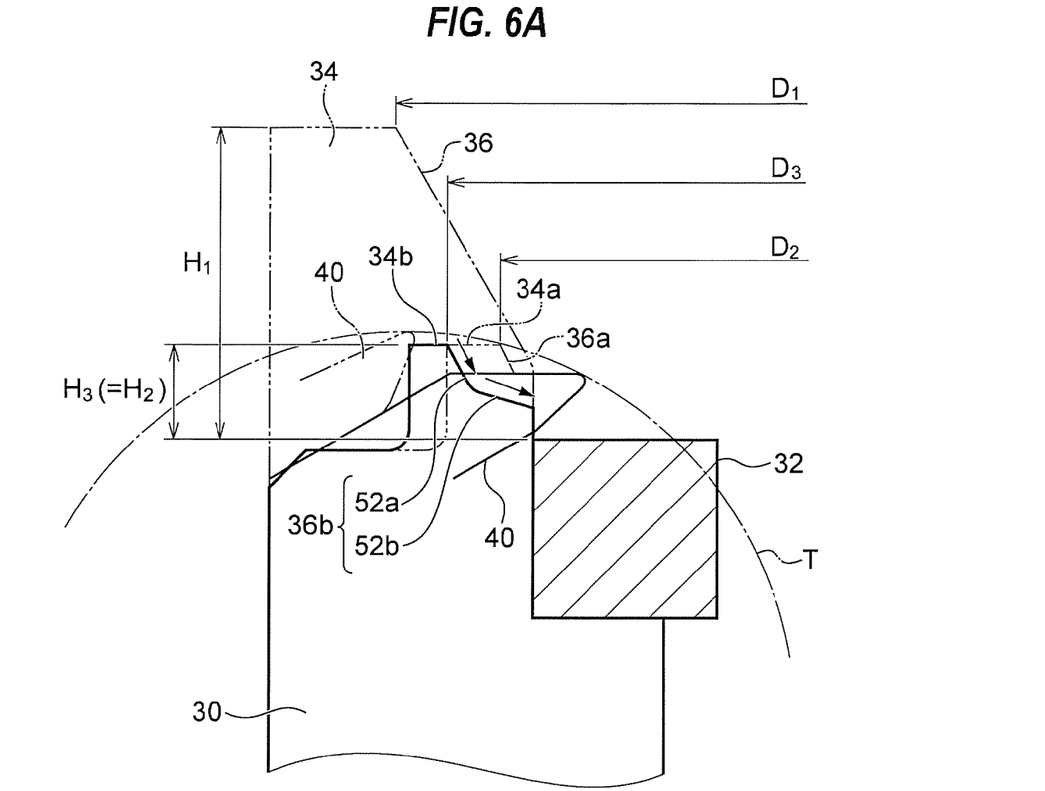
FIG. 6A is an enlarged cross-sectional view showing a main part of the substrate chuck mechanism shown in FIG. 5, together with a guide portion of the substrate chuck mechanism shown in FIG. 2 whose inner circumferential surface serves as a guide surface, and with a guide portion of the substrate chuck mechanism shown in FIG. 3 whose inner circumferential surface serves as a guide surface.

FIG. 6A is an enlarged view showing a main part of the substrate chuck mechanism 16*b*. In FIG. 6A, the curved line T indicates a locus of a tip end of the chuck claw 40. In FIG. 6A, the guide portion 34 whose inner circumferential surface serves as a guide surface 36 of the substrate chuck mechanism 16 shown in FIG. 2, and the guide portion 34*a* whose inner circumferential surface serves as a guide surface 36*a* of the substrate chuck mechanism 16*a* shown in FIG. 3 are indicated by imaginary lines for comparison.

The substrate W is held by a robot hand and transferred above the substrate stage 14*a* with the chuck claws 40 kept open outwardly. By lowering the robot hand, the substrate W is transferred from the robot hand to the pencil-type scrubbing cleaning apparatus 10. Then, by turning the chuck claws 40 inward in a closing direction, the peripheral portion of the substrate W is held between the chuck claws 40 and the substrate placing portions 32.

At this time, as the robot hand is lowered, the substrate W firstly falls down by its own weight with its outer circumferential end surface guided by the first guide surfaces 52*a*, and slides down the first guide surfaces 52*a* to be positioned even if teaching error by an operator or the like occurs. Therefore, the inclined angles of the first guide surfaces 52*a* are set to be large to some extent. Then, after the robot hand is lowered to a predetermined position and the robot hand is retreated, the chuck claws 40 are turned inward in a closing direction. At this time, in the case where the substrate W is not positioned accurately, the substrate W is pressed by any of the chuck claws 40 and moved inward. During this inward moving, the outer circumferential end surface of the substrate W is guided by the second guide surfaces 52*b* and the substrate W is positioned. Therefore, the inclined angles of the second guide surfaces 52*b* do not need to be so large, and can be set to be much smaller than the inclined angles of the first guide surfaces 52*a*. The first guide surfaces 52*a* and the second guide surfaces 52*b* are inclined downwardly toward the radially inward directions, respectively of the substrate stage 14*a*.

Figure 6B:
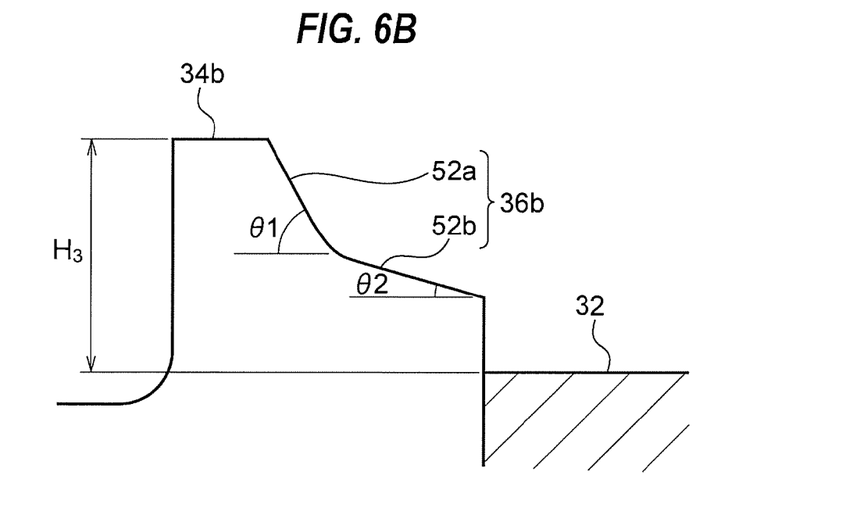
FIG. 6B is a schematic cross-sectional view showing a guide surface 36b comprising a first guide surface 52a and a second guide surface 52b.

FIG. 6B is a schematic cross-sectional view showing the guide surface 36*b* comprising the first guide surface 52*a* and the second guide surface 52*b*. As shown in FIG. 6B, the inclined angle $\theta 1$ of the first guide surface 52*a* is 60±5°, and the inclined angle $\theta 2$ of the second guide surface 52*b* is 30±5°. The boundary between the first guide surface 52*a* and the second guide surface 52*b* is configured to be a curved surface with a radius of approximately 0.5 to 1.0R for allowing the substrate to move smoothly.

As shown in FIG. 6B, the first guide surface 52*a* extends to a height $(\frac{1}{2})H_3$ from an inner end portion (the part constituting the inner diameter $D_3$ of the opening) of the guide portion 34*b* with the angle $\theta 1$(60±5°), and the inclined angle is changed there and the second guide surface 52*b* extends from there to an inner end portion of the guide surface 36*b* with the angle $\theta 2$(30±5°). The boundary between the first guide surface 52*a* and the second guide surface 52*b* is located at the height $(\frac{1}{2})H_3$ from the upper surface of the substrate placing portion 32.

In this manner, by making the inclination of the second guide surface 52*b* of the guide portion 34*b* gentler than the inclination of the first guide surface 52*a*, as shown in FIG. 6A, the height $H_3$ of the guide portion 34*b* from the upper surface of the substrate placing portion 32 can be limited to substantially the same height as the height $H_2$ of the guide portion 34*a* of the substrate chuck mechanism 16*a* from the upper surface of the substrate placing portion 32 shown in FIG. 3 as an example, and in order to accept the substrate W within the opening (scoop opening) defined by connecting the upper ends of the first guide surfaces 52*a* of the guide portions 34*b* in a circular arc shape, the inner diameter $D_3$ of the opening can be set to be larger than the inner diameter $D_2$ of the opening (scoop opening) defined by connecting the upper ends of the guide surfaces 36*a* of the guide portions 34*a* of the substrate chuck mechanisms 16*a* in a circular arc shape shown in FIG. 3 as an example.

Figure 7:
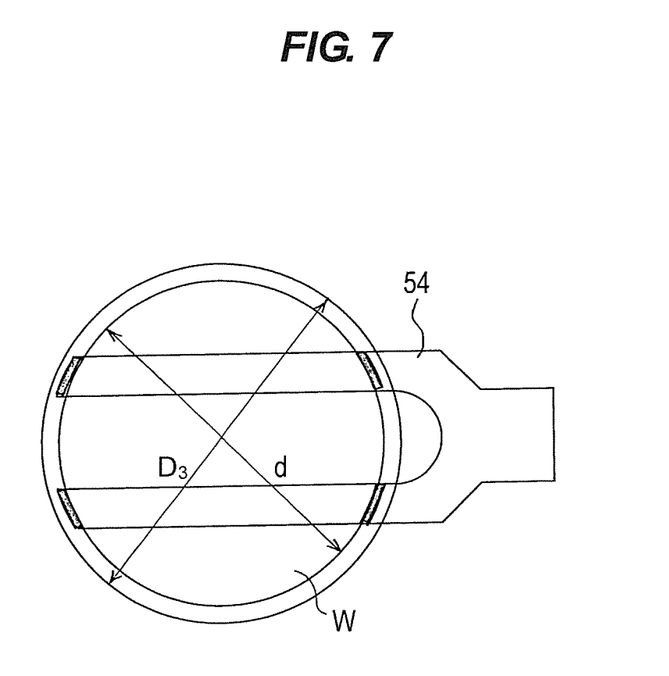
FIG. 7 is a view showing the relationship between a robot hand, a diameter d of a substrate, and an inner diameter $D_3$ of an opening (scoop opening) defined by connecting upper ends of the first guide surfaces of the guide portions.

FIG. 7 shows the relationship between the robot hand 54, the diameter d of the substrate W, and the inner diameter $D_3$ of the opening (scoop opening) defined by connecting the upper ends of the first guide surfaces 52*a* of the guide portions 34*b* in a circular arc shape. The inner diameter $D_3$ of the opening is set to be 305.785 mm in this example so that any chuck error cannot be caused with an existing robot teaching even if the tolerances at the worst cases are accumulated.

Specifically, the inner diameter $D_3$ of the opening is set to be a value obtained by adding a tolerance value B to a value A which is a sum of the outer diameter of the substrate to be processed: 299.8 mm and a calculated value based on three maximum values comprising a maximum value of positioning error of the robot for holding and transferring the substrate with a robot hand: ±0.5 mm, a maximum value of deviation range of the substrate within the robot hand: ±1.232 mm, and a maximum value of teaching error by an operator: ±0.75 mm (including a robot resolution 0.12 mm). More specifically, each of the maximum value of positioning error of the robot, the maximum value of deviation range of the substrate within the robot hand, and the maximum value of teaching error is squared, and the squared values are summed, then a square root of the sum is calculated. By adding the value calculated in this manner to the outer diameter value of the substrate, the value A is obtained. By adding the tolerance value B to the value A, the inner diameter $D_3$ of the opening is obtained.

Accordingly, the value A is derived to be 302.82 mm by the following formula.

$$A=299.8+((1.23\times2)^2+(0.5\times2)^2+(0.75\times2)^2)^{1/2}$$

Then, when the tolerance value B is 2.965 mm, the inner diameter $D_3$ of the opening is 305.785 mm which is derived by adding the tolerant value B to the value A (302.82(A)+2.965(B)=305.785($D_3$)). The tolerance value B is determined arbitrarily. The value A may be determined by adding absolute values of the aforementioned three maximum values to the outer diameter value of the substrate to be processed.

As described above, according to the substrate chuck mechanism 16b of this example, the inclination of the second guide surface 52b of the guide portion 34b can be made gentler than the inclination of the first guide surface 52a. Therefore, the height of the guide portion 34b can be limited to be low, and in order to accept the substrate W reliably within the opening (scoop opening) defined by connecting the upper ends of the first guide surfaces 52a in a circular arc shape, the inner diameter $D_3$ of the opening can be set to be larger than the diameter d of the substrate W, thereby securing a sufficient guide width.

According to the pencil-type scrubbing cleaning apparatus 10, the surface of the substrate W is scrub-cleaned by supplying a cleaning liquid from the upper cleaning liquid supply nozzle 18 (see FIG. 1) onto the surface of the substrate W which is gripped at its peripheral portion and rotated at a predetermined rotational speed by the substrate chuck mechanisms 16b, and simultaneously by moving the pencil-type cleaning member 26 in one direction while pressing the pencil-type cleaning member 26 at a predetermined pressing force against the surface of the substrate W.

At this time, the eight arms 12 are provided and the substrate chuck mechanisms 16b are provided at the distal ends of the respective arms 12, and hence positions where the substrate W is supported can be increased, and intervals between mutually adjacent substrate chuck mechanisms 16b can be shorter. Thus, deformation or breakage of the substrate W caused by pressing of the pencil-type sponge 26 against the substrate W can be prevented. The number of the arms 12 is arbitrarily set to be not less than eight.

Figure 8:
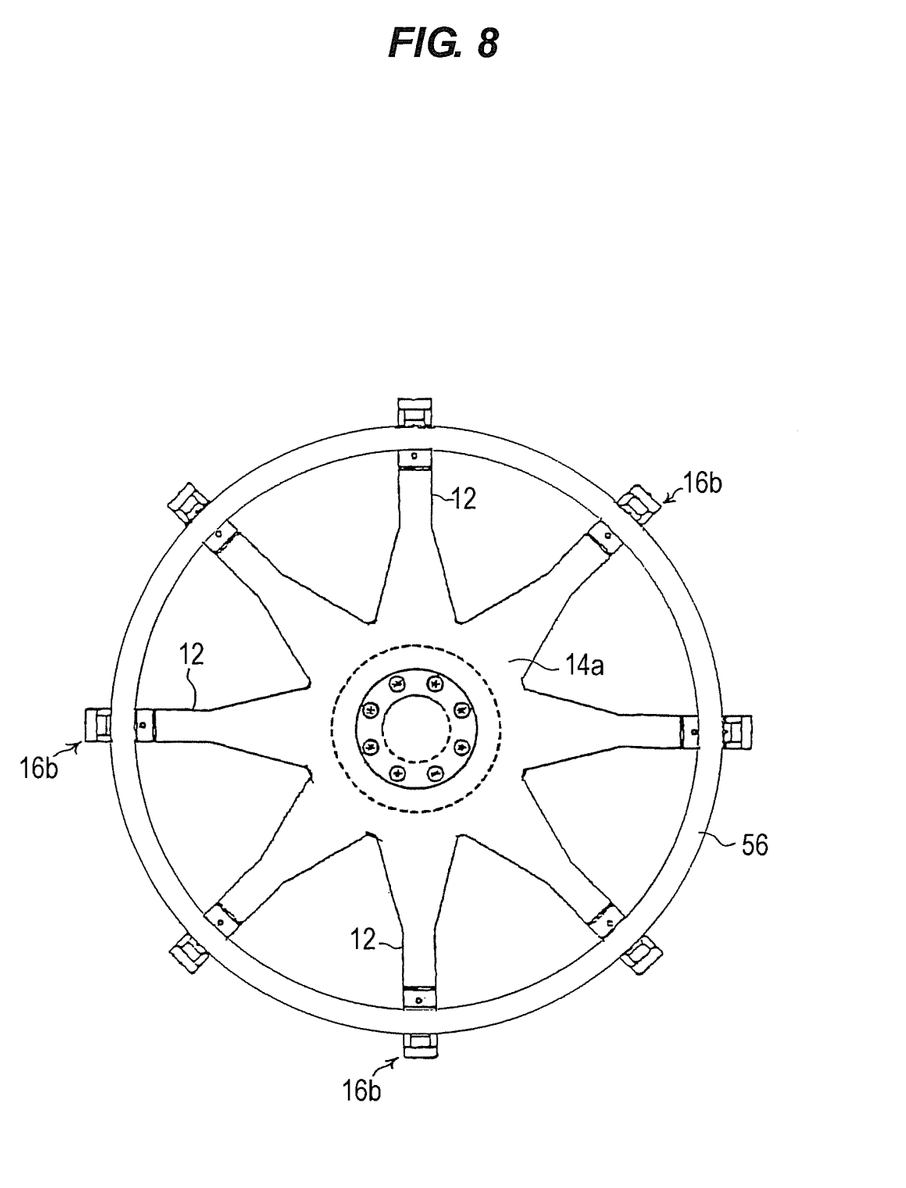
FIG. 8 is a schematic plan view showing a substrate processing apparatus according to another embodiment of the present invention.

FIG. 8 is a schematic plan view showing a substrate processing apparatus according to another embodiment of the present invention. The configuration of this example differs from the aforementioned embodiment in that the peripheral portion of the substrate W is placed and held on a substrate placing portion 56 which extends continuously in a ring shape. Although not shown in the figure, grooves for water removal are formed on the substrate placing portion 56 at a predetermined pitch along a circumferential direction of the substrate placing portion 56.

In this manner, by supporting the peripheral portion of the substrate continuously in a ring shape with the substrate placing portion 56 extending continuously in a ring shape, deformation or breakage of the substrate caused by pressing of the pencil-type sponge or the like against the substrate can be prevented.

Figure 9:
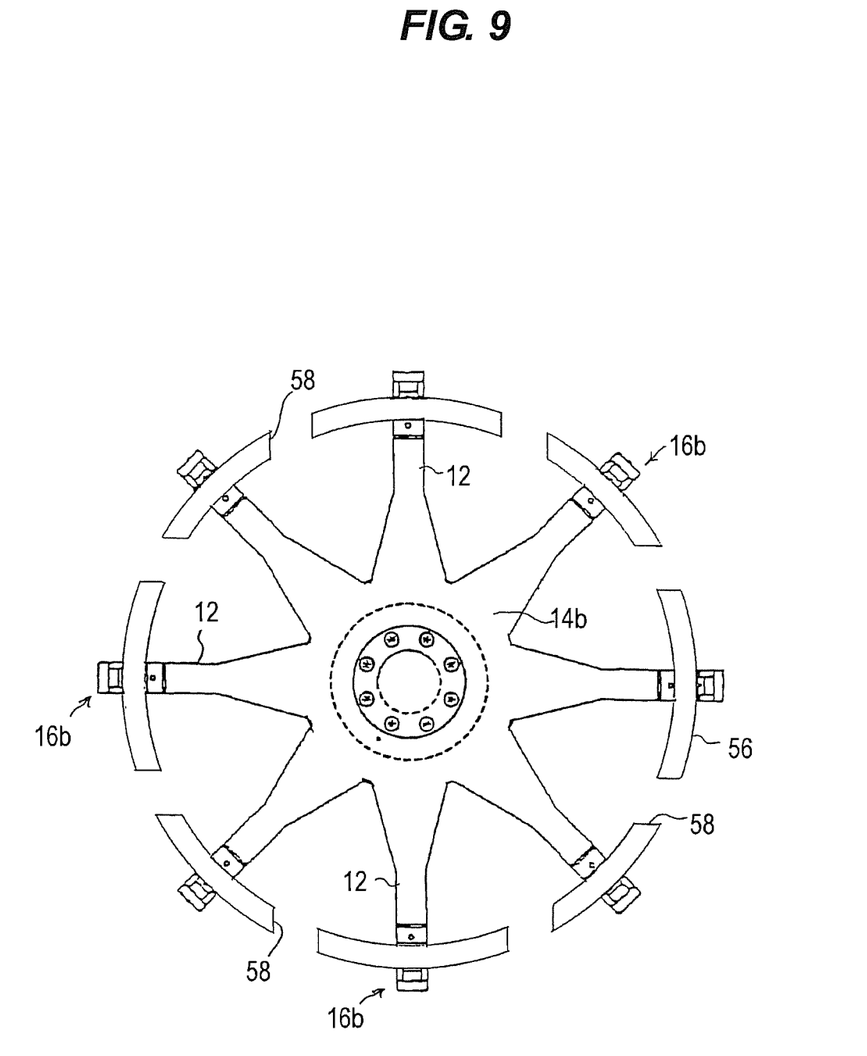
FIG. 9 is a schematic plan view showing a substrate processing apparatus according to still another embodiment of the present invention.

FIG. 9 is a schematic plan view showing a substrate processing apparatus according to still another embodiment of the present invention. The configuration of this example differs from the embodiment shown in FIG. 8 in that cutouts 58 for allowing the robot hand to pass therethrough are provided at predetermined positions of the substrate placing portion 56 extending continuously in a ring shape. With this configuration, the substrate held by the robot hand can be transferred to the substrate processing apparatus without causing the robot hand to interfere with the substrate placing portion 56.

In the above examples, although the present invention is applied to the pencil-type scrubbing cleaning apparatus, it should be understood that the present invention is applicable to other substrate processing apparatuses used for processing substrates, such as a spin drying apparatus (SRD) and an IPA (isopropyl alcohol) drying apparatus, which are used as semiconductor wafer processing apparatuses.

Although certain preferred embodiments of the present invention have been shown and described in detail, it should be understood that various changes and modifications may be made without departing from the scope of the appended claims.

What is claimed is:

1. A substrate processing apparatus for gripping a peripheral portion of a substrate and rotating the substrate to process the substrate, said substrate processing apparatus comprising:
   a rotatable substrate stage having a plurality of arms extending radially; and
   substrate chuck mechanisms fixed to respective distal ends of said arms and configured to grip the peripheral portion of the substrate;
   said substrate chuck mechanism comprising:
      a chuck body having a substrate placing portion configured to place the peripheral portion of the substrate and a guide surface configured to guide an outer circumferential end surface of the substrate and to position the substrate when the substrate is placed on said substrate placing portion; and
      a chuck claw rotatably supported on said chuck body and configured to hold the peripheral portion of the substrate between said substrate placing portion and said chuck claw by turning said chuck claw inward in a closing direction,
      wherein said guide surface comprises a first guide surface configured to guide the outer circumferential end surface of the substrate which falls down by its own weight when the substrate is placed and held on said substrate placing portion, and a second guide surface configured to guide the outer circumferential end surface of the substrate while the substrate is pressed and moved inward along the second guide surface by turning said chuck claw inward in a closing direction when the peripheral portion of the substrate is held between said substrate placing portion and said chuck claw by turning said chuck claw inward in the closing direction.

2. A substrate processing apparatus according to claim 1, wherein an inner diameter of an opening defined by connecting upper ends of said first guide surfaces in a circular arc shape is set to be a value obtained by adding a tolerance value to a value which is a sum of an outer diameter of the substrate to be processed and a calculated value based on three maximum values comprising a maximum value of positioning error of a robot for holding and transferring the substrate with a robot hand, a maximum value of deviation range of the substrate within the robot hand, and a maximum value of teaching error by an operator.

3. A substrate processing apparatus according to claim 1, wherein a height of said guide portion from an upper surface of said substrate placing portion is in the range of 2.0 mm to 5.0 mm.

4. A substrate processing apparatus according to claim 1, wherein the number of said arms is set to be not less than eight.

5. A substrate processing apparatus according to claim 1, wherein said substrate placing portion is configured to extend continuously in a ring shape.

6. A substrate processing apparatus according to claim 1, wherein said substrate placing portion is configured with at least one cutout.

* * * * *